United States Patent
Celia, Jr.

(10) Patent No.: US 12,532,703 B2
(45) Date of Patent: Jan. 20, 2026

(54) SELF-ALIGNING TIP

(71) Applicant: MRSI Systems LLC, Tewksbury, MA (US)

(72) Inventor: Nicholas Samuel Celia, Jr., Avon, MA (US)

(73) Assignee: MRSI Systems LLC, Tewksbury, MA (US)

( * ) Notice: Subject to any disclaimer, the term of this patent is extended or adjusted under 35 U.S.C. 154(b) by 474 days.

(21) Appl. No.: 18/114,763

(22) Filed: Feb. 27, 2023

(65) Prior Publication Data

US 2023/0223289 A1 Jul. 13, 2023

Related U.S. Application Data

(63) Continuation-in-part of application No. PCT/US2021/046985, filed on Aug. 20, 2021.

(60) Provisional application No. 63/070,873, filed on Aug. 27, 2020.

(51) Int. Cl.
| | |
|---|---|
| *H01L 21/68* | (2006.01) |
| *B23Q 3/155* | (2006.01) |
| *H01L 21/683* | (2006.01) |
| *H01L 23/00* | (2006.01) |

(52) U.S. Cl.
CPC .......... *H01L 21/68* (2013.01); *B23Q 3/15513* (2013.01); *H01L 21/6838* (2013.01); *H01L 24/75* (2013.01); *H01L 24/83* (2013.01); *H01L 2224/75843* (2013.01); *H01L 2224/81191* (2013.01)

(58) Field of Classification Search
CPC ..... H01L 21/68; H01L 21/6838; H01L 24/75; H01L 24/83; H01L 2224/75843; H01L 2224/81191; B23Q 3/15513
See application file for complete search history.

(56) References Cited

U.S. PATENT DOCUMENTS

| | | | |
|---|---|---|---|
| 8,550,766 B2 * | 10/2013 | Dromard ........... | H01L 21/67144 414/752.1 |
| 9,653,332 B1 * | 5/2017 | Tsironis ............ | H01L 21/67742 |
| 9,911,710 B2 * | 3/2018 | Celia, Jr. ............ | B23K 37/0408 |

(Continued)

FOREIGN PATENT DOCUMENTS

| | | |
|---|---|---|
| CN | 103887219 A | 6/2014 |
| CN | 110741469 A | 1/2020 |

(Continued)

OTHER PUBLICATIONS

International Search Report and Written Opinion for PCT Appl. No. PCT/US2021/046985 mail date Dec. 15, 2021, 8 pages.

(Continued)

*Primary Examiner* — Ryan J. Walters
(74) *Attorney, Agent, or Firm* — Maine Cernota & Curran

(57) ABSTRACT

A die placement system provides a tip body and die placement head to ensure planarity of a die to substrate without the need for calibration prior to each pick and place operation. A self-aligning tip incorporated into a tip body aids in die placement/attachment. This tip provides for global correction of planarity errors that exist between a die and substrate, regardless of whether those errors stem from gantry (i.e. die-side misalignment) or machine deck tool (i.e. substrate-side misalignment) misalignment.

19 Claims, 15 Drawing Sheets

(56) References Cited

U.S. PATENT DOCUMENTS

| | | | |
|---|---|---|---|
| 10,588,981 B2 * | 3/2020 | Celia, Jr. ........... | H01L 21/67092 |
| 11,791,197 B2 * | 10/2023 | Celia, Jr. ............... | H01L 21/687 |
| | | | 156/272.8 |
| 2010/0254788 A1 | 10/2010 | Dromard | |
| 2016/0126213 A1 | 5/2016 | Celia, Jr. | |
| 2018/0226376 A1 | 8/2018 | Huska | |
| 2018/0323088 A1 | 11/2018 | Celia, Jr. | |
| 2020/0075381 A1 | 3/2020 | De Bock | |
| 2020/0077550 A1 | 3/2020 | Hoefs | |

FOREIGN PATENT DOCUMENTS

| | | |
|---|---|---|
| JP | 2007123834 A | 5/2007 |
| KR | 1020180098986 A | 9/2018 |
| WO | 2017031100 A1 | 2/2017 |

OTHER PUBLICATIONS

International Preliminary Report on Patentability for PCT Appl. No. PCT/US2021/046985 mail date Mar. 9, 2023, 5 pages.
CNIPA First Office Action with Search Report, Jun. 27, 2025, 6 pages.

* cited by examiner

114

SELF-ALIGNING TIP

RELATED APPLICATIONS

This application is a continuation in part of PCT/US2021/046985, with an International filing date of Aug. 20, 2021, which claims the benefit of U.S. Provisional Application No. 63/070,873, filed Aug. 27, 2020. Each of these applications is herein incorporated by reference, in their entirety, for all purposes.

FIELD OF THE DISCLOSURE

The invention relates to micro-electronic packaging, and, more particularly, to a system and method for ensuring the planarity of a die to a substrate when attaching dies to a substrate.

BACKGROUND

The manufacture of integrated circuits (ICs) generally involves the use of complex lithographic processes to form microscopic solid-state devices and circuits in semiconductor wafers. These lithographic processes typically include forming layers of material on the wafer, patterning the layers, doping the substrate and/or the patterned layers and heat-treating (e.g., annealing) the resulting structures. These processes are then repeated to build up the IC structure. The result is a wafer containing a large number of ICs.

After the wafer is formed, it then will typically go through a sorting process. Sorting involves electrically testing each IC chip on the wafer for functionality. After sorting, the wafer is separated into individual IC chips, which are then packaged individually or in groups for incorporation onto a substrate, such as a printed circuit board (PCB). At this stage of the process, the individual ICs are typically referred to as dies. These dies must then be placed on and fixed to specific locations on a substrate such that they become electronically and/or optically connected to other components with which they are designed to interact.

In the broadest sense, the die attach process can be either epoxy based or eutectic. In epoxy die attach, dies are placed on epoxy, typically at room temperature. They are then later reflowed in an oven to 'cure' the epoxy and freeze the die in place. For some epoxy applications where UV epoxy is used, the curing is done in-situ using targeted UV light to freeze/cure the die to prevent it from moving post-placement. In-situ typically implies a die bonding head is holding the die in position while the die is being cured. For epoxy processes, especially for larger die sizes, die to substrate planarity is important for maintaining uniform epoxy bond-line thickness under the die.

In a eutectic die attach process, the dies are typically re-flowed in-situ. Solder can either be pre-deposited on the back of the die or substrate. A die with solder bumps is an example of pre-deposited solder on die. In some cases, the entire die bottom surface can be pre-deposited with solder. In other cases, a solder pre-form is used. The pre-form (typically <25 um thick) is placed first and the die is placed on top of the pre-form. Then, with the bond head holding the die in place, heat is applied to reflow the die.

For high power applications, typically no pre-deposited solder or pre-form is used. For these applications, a gold-silicon (Au—Si) interface is created by scrubbing dies at temperatures >400 C. At high temperatures, the silicon diffuses into the gold; the scrubbing motion minimizes voids, or air pockets, in the Au—Si interface. The voids lead to hot spots on the die when the dies are energized, leading to failures. For these applications, the dies are thinned down (50 um or less) to make them dissipate heat more effectively. In such applications, (when scrubbing the die to substrate), if contact is not planar, Au—Si diffusion occurs only in the point/area of contact, resulting in die failure when bonding wires to it in a subsequent process or when the dies are energized.

Thermo-compression bonding is a common method of attaching a die to a substrate. While the term thermo-compression bonding typically refers to a specific die attach process with specific attributes, generally involving relatively high forces (i.e. >>1 kg) and is most commonly used where dies have thousands of solder bumps that need a minimum force (in grams per bump) to flatten to make contact with the substrate below before being heated to reflow temperatures, the term is also used more generally herein to refer to a die attach process. The planarity between the bond head and substrate is critical to this process as well to ensure all the bumps make contact with their corresponding connecting pads below and reflow uniformly without attaching/bridging to its neighboring bump.

The machine responsible for placing the dies on a substrate is referred to as a die placement system, thermo-compression bonding system, and, sometimes, a "die bonder" while placement of dies onto a substrate or a printed circuit board is generally referred to in the industry as a die placement, die attach, or die bonding operation. During a die placement operation, die positioning must be very precise and accurate to ensure that interconnections between the die and substrate are properly established.

While these techniques have served the industry well for a number of years, existing die bonding systems and methods are unable to achieve satisfactory bonding performance and yield when used for bonding the latest generations of dies to substrates. These new generations of dies and substrates utilize an increased number of connections, solder bumps or otherwise, between the die and substrate, typically without a corresponding increase in the size of the die or substrate. To allow dies of similar size to accommodate these additional connections, each connection has become smaller and placement accuracy, including planarity, becomes even more critical. For instance, in the newer designs for photonic packages, the thickness of the pre-deposited solder layer is extremely thin. As a result, die-to-substrate planarity needs to be controlled to a higher degree than ever before to ensure all solder pads on the die are reflowed evenly.

Furthermore, dies can vary, sometimes considerably, in size, thickness, planarity, etc., but must still be placed with a consistent, precise and accurate amount of force that is evenly distributed. For example, when placing a die on epoxy, it is critical that, after placement, the epoxy bond line thickness criteria are met. When placing very thin dies (i.e. 50 um or less) in a eutectic attach process, the impact force, if high, can lead to die cracks. The margin of error in such placement operations is quite small and even where the average force is within acceptable limits, planarity errors between die and substrate, which are always present, can still result in high localized forces leading to failure. Unfortunately, current methods of ensuring planarity typically result in slowed cycle times due to the need for recalibration for each die or use a single calibration that fails to take into account die-to-die variation, resulting in misalignment.

For example, one currently available solution involves the use of a tip mounted to a gimbal, which may be referred to as a gimballing tip. While helpful to ensure planarity, this solution does not prevent die scrubbing since the axis of rotation is not at the bottom of the die, resulting in relative motion between the die and substrate during placement, which can damage these fragile structures. Furthermore, current designs require a minimum force (typically >30 grams) to force the gimbal to self-level, which can damage the die/substrate and/or limit placement accuracy.

Still further, in many instances, the challenge of such operations is increased due to the need for die placement systems to place multiple dies, which are often different from one another, on a single substrate. Since different types of dies are not uniform in size or shape, the die placement head, which is also herein referred to as the tip body, the portion of the die placement system in contact with the dies themselves and ultimately typically responsible for their precise placement (in some machines, the substrate theta orientation is adjustable), is specific to each type of die to be placed. In such situations, the die placement head must be swapped during the die placement operation with one that corresponds to the next die type to be placed before the next die placement operation can proceed.

This swapping of the die placement head can be manual or automatic. Manual methods require opening of the machine by a human operator and subsequent exchange of the die placement head while automatic swapping is typically accomplished by moving the die placement head to a tool carrier and swapping out the die placement head for one corresponding to the next die to be placed. Both manual and automatic swapping of die placement heads slows down the die placement process and manual die placement head swapping also poses a significant risk of contamination, since the system must be opened for the swapping operation. While automatic swapping of die placement heads is quicker than manual die placement head swapping, it still requires that the die placement head travel a significant distance within the system, resulting in the possible loss of placement accuracy due to tracking issues such as drift and an increase in cycle time due to time spent traversing this distance.

Today, with a wide variety of high density die package designs already available, with still more being developed every day, the requirements on die placement systems are increasing. Current generation dies require die bonding equipment that can deliver precision, versatility and speed beyond what is currently available to maximize productivity while minimizing defects resulting from faulty die placement, which, considering the effort that has already gone into creating and testing dies at this point in the production process, is an especially great concern. Future generations of dies are very likely to impose even higher requirements on die placement equipment.

What is needed, therefore, are techniques for improving the accuracy, precision, and consistency of die placement and the application of die placement force by ensuring planarity between a die and substrate and minimizing the force necessary to cause the die and substrate to planarize while minimizing scrubbing and accelerating the die placement process, including situations where multiple dies must be placed on a single substrate.

SUMMARY

A novel tip body ensures planarity of a die to substrate without the need for calibration prior to each pick and place operation. In a different configuration, the same tip body provides full angular compliance between a die and substrate during a bonding operation, allowing strong and accurate bonding even where the two are significantly non-planar.

Embodiments also utilize a die-head mounted turret to accelerate cycle times and reduce the risk of contamination associated with repeatedly opening the die bonding system to manually change tips.

One embodiment of the present disclosure provides a self-aligning tip system comprising: a tip holder comprising, a threaded section disposed on a distal end thereof, and a hollow inner cavity; a lockable swivel collar disposed in the hollow inner cavity of the tip holder, the lockable swivel collar comprising a central aperture configured to retain a tip; and a locking cap comprising a central aperture configured to allow a tip to pass therethrough, wherein the locking cap is configured to be threaded onto the threaded section of the tip holder and to retain the lockable swivel collar inside of the inner cavity of the tip holder, wherein, when the locking cap is installed loosely, a tip retained in the lockable swivel collar is allowed to swivel in roll, pitch and yaw while maintaining accurate theta registration, and wherein, when the locking cap is installed tightly, a tip retained in the lockable swivel collar is locked in terms of roll, pitch and yaw.

Another embodiment of the present disclosure provides such a self-aligning tip system wherein the tip holder comprises an upper section configured to be retained in a die bonding system.

A further embodiment of the present disclosure provides such a self-aligning tip system wherein the lockable swivel collar comprises swivel ball profiles on top and bottom sides thereof and wherein the tip holder and locking cap comprise corresponding swivel ball profiles on a bottom portion and a top portion thereof, respectively.

Yet another embodiment of the present disclosure provides such a self-aligning tip system further comprising a spring disposed between the lockable swivel collar and locking cap.

A yet further embodiment of the present disclosure provides such a self-aligning tip system wherein the locking cap and lockable swivel collar comprise spring seats configured to locate the spring.

Still another embodiment of the present disclosure provides such a self-aligning tip system wherein the spring is configured to bias a tip held retained in the lockable swivel collar to a neutral position.

A still further embodiment of the present disclosure provides such a self-aligning tip system further comprising a magnet disposed in the tip holder.

Even another embodiment of the present disclosure provides such a self-aligning tip system wherein the magnet is configured to bias a tip held retained in the lockable swivel collar to a neutral position.

An even further embodiment of the present disclosure provides such a self-aligning tip system further comprising a magnet disposed in the tip holder.

A still even another embodiment of the present disclosure provides such a self-aligning tip system wherein the magnet is configured to bias a tip held retained in the lockable swivel collar to a neutral position.

Still yet another embodiment of the present disclosure provides such a self-aligning tip system wherein the self-aligning tip system is configured such that tip alignment occurs with the center of rotation located at the bottom of a die held by a tip retained by the lockable swivel collar.

A still yet further embodiment of the present disclosure provides such a self-aligning tip system further comprising at least one air-port disposed in the tip holder.

Even yet another embodiment of the present disclosure provides such a self-aligning tip system wherein the self-aligning tip system is configured to utilize vacuum to lock the tip into position.

An even yet further embodiment of the present disclosure provides such a self-aligning tip system further comprising a tip retained in the lockable swivel collar wherein the tip comprises at least one air-port configured to allow the transmission of positive pressure and/or vacuum from a backside of the tip to a distal end thereof, the distal end being configured to mount a die to a substrate.

Still even yet another embodiment of the present disclosure provides such a self-aligning tip system wherein with the tip in an unlocked position, the tip is configured to utilize a burst or steady stream of air through the at least one air-port disposed therein to reduce the friction associated with tip alignment.

A still even yet further embodiment of the present disclosure provides such a self-aligning tip system wherein the lockable swivel collar utilizes a clamp-collar retention system to retain a tip.

Yet still even another embodiment of the present disclosure provides such a self-aligning tip system wherein the locking cap further comprises preloaded locking tabs configured to prevent rotation of the lockable swivel collar relative to the self-aligning tip system, once tightened.

One embodiment of the present disclosure provides a method of planarizing a tip to a substrate, the method comprising: using a self-aligning tip system as described herein: retaining a tip within the lockable swivel collar; loosening the locking cap, thereby allowing the tip to swivel in roll, pitch and yaw while maintaining accurate theta registration; bringing the tip into contact with the substrate; and tightening the locking cap, thereby locking the tip in roll, pitch and yaw.

One embodiment of the present disclosure provides a die bonding system comprising: a turret comprising a rotation measuring device and a plurality of self-aligning tip system holding portions positioned substantially adjacent a periphery thereof wherein each self-aligning tip system holding portion comprises two concentric apertures, a first aperture and a second aperture, said first aperture extending fully through said turret and said second aperture positioned on the side of the turret opposite said first aperture and concentric therewith, wherein said second aperture extends only partially into said turret and wherein, upon rotation, each of said plurality of self-aligning tip system holding apertures can be brought into alignment with a tool; and a motor configured to rotate said turret upon activation, wherein at least one of the plurality of self-aligning tip system holding portions comprises a self-aligning tip system.

One embodiment of the present disclosure provides a self-aligning tip system comprising: a tip holder comprising at least one air-port, a threaded section disposed on a distal end thereof, and a hollow inner cavity; a lockable swivel collar comprising a central aperture configured to retain a tip; a locking cap disposed in the hollow inner cavity of the tip holder, the lockable swivel collar comprising a central aperture configured to allow a tip to pass therethrough, wherein the locking cap is configured to be threaded onto the threaded section of the tip holder and to retain the lockable swivel collar inside of the inner cavity of the tip holder; and a spring disposed between the lockable swivel collar and locking cap, wherein, when the locking cap is installed loosely, a tip retained in the lockable swivel collar is allowed to swivel in roll, pitch and yaw while maintaining accurate theta registration, wherein, when the locking cap is installed tightly, a tip retained in the lockable swivel collar is locked in terms of roll, pitch and yaw, wherein the tip holder comprises an upper section configured to be retained in a die bonding system, wherein the spring is configured to bias a tip held retained in the lockable swivel collar to a neutral position, wherein the lockable swivel collar comprises swivel ball profiles on top and bottom sides thereof and wherein the tip holder and locking cap comprise corresponding swivel ball profiles on a bottom portion and a top portion thereof, respectively.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

As a preliminary matter, for the purposes of this disclosure, the X, Y, and Z axis should be understood to refer to the three orthogonal linear axes while "T", which may also be referred to as Theta or Θ, refers to a revolute axis.

Thermo-compression bonding is one method used to bond a die, also known as a chip, to a substrate. It is sometimes also referred to as diffusion bonding, pressure joining, thermo-compression welding or solid state welding. This process takes advantage of surface diffusion, grain boundary diffusion and bulk diffusion to physically and electrically connect a die to a substrate.

Planarity errors are always present in both pick and place machinery and customer dies/substrates. These errors make robust attachments of dies to substrates a constant challenge, especially when there is no solder or preform used (e.g. certain types of eutectic bonding). Embodiments of the present disclosure solve this problem by employing both a global planarity correction for the pick and place gantry/deck tools along with the option to use a fully compliant tip 104 to help with varying planarity errors in a customer's dies and substrates.

The die placement system described herein, in embodiments, utilizes a novel self-aligning tip system 100 to ensure planarity of a die to substrate without the need for calibration prior to each pick and place operation. More specifically, embodiments utilize a tip 104 held by a tip holder 102 adjustably, but lockably, retained by the self-aligning tip system 100 to aid in die placement/attachment. This self-aligning tip system 100 provides for the global correction of planarity errors that may exist between a die and substrate, regardless of whether those errors stem from gantry (i.e. die-side misalignment) or machine deck tool (i.e. substrate-side misalignment) misalignment. This is accomplished, in embodiments, by the tip 104 self-aligning to a die having non-parallel top and bottom surfaces.

Figure 1:
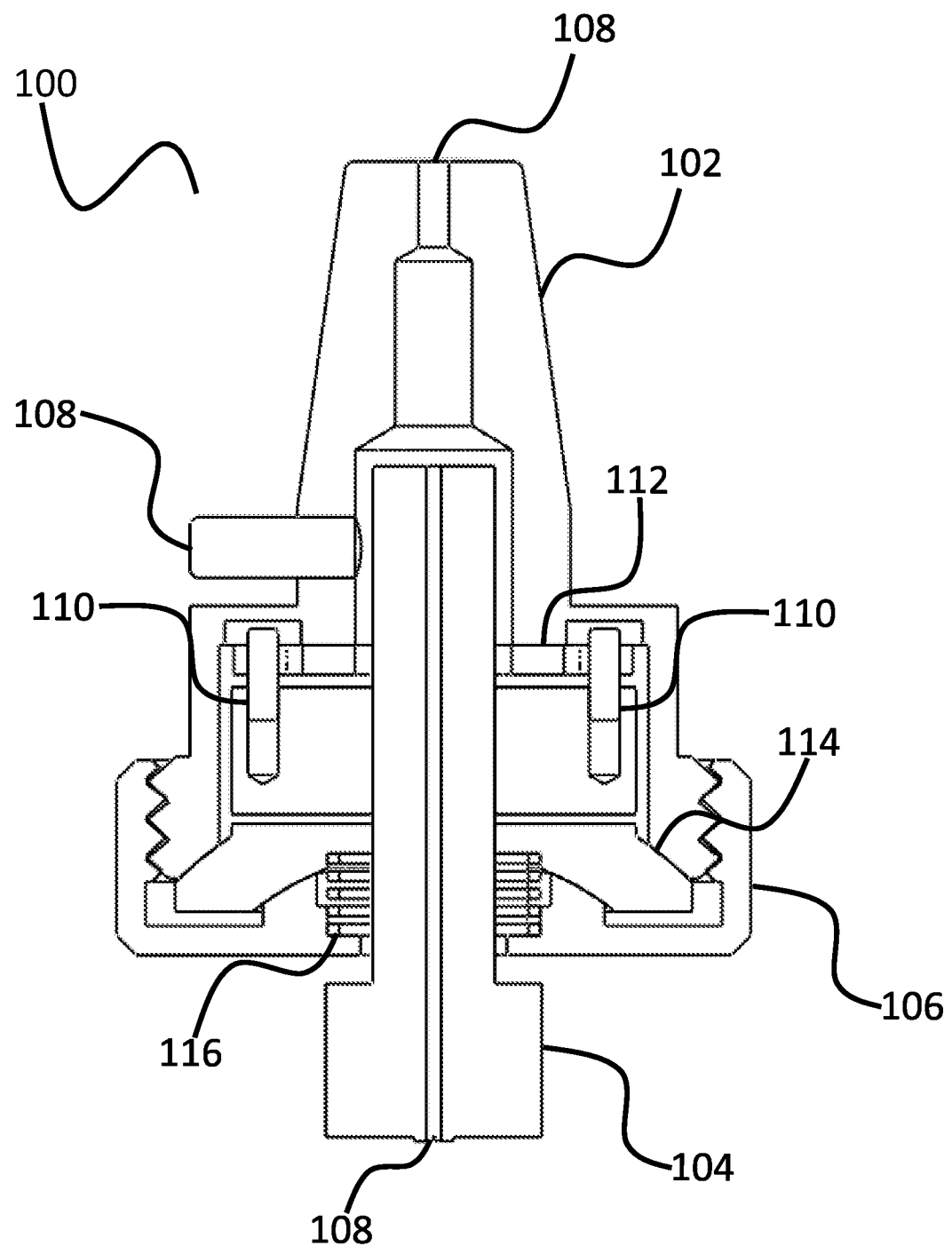
FIG. 1 is a section view of a self-aligning tip system using a coupling-style anti-rotate feature with the tip locked in a neutral position showing the anatomy thereof, in accordance with embodiments of the present disclosure.

Now referring to FIG. 1, the anatomy of a self-aligning tip system 100, in accordance with embodiments of the present disclosure, is shown. More specifically, the self-aligning tip system 100 is configured to retain a tip 104 such that the tip 104 is allowed to fully swivel in roll, pitch and yaw while maintaining accurate theta registration, thereby ensuring that a die held by the tip 104 is planar to a substrate on which it is to be affixed. Embodiments enable theta registration using a lockable swivel collar 114 and swivel ball system, in embodiments having elements disposed in a locking cap 106, the tip holder 102, and the lockable swivel collar 114, to allow relative motion between the tip 104 and self-aligning tip system 100. Exploded views better showing how the components fit and work together are provided in FIGS. 2 and 3.

In embodiments, the tip holder 102 comprises at least one, in embodiments multiple, air-port(s) 108, which is/are configured to allow the communication of vacuum and/or positive pressure through the tip holder 102 and to a tip 104 held therein allowing for, inter alia, the tip 104 to be locked or floated programmatically.

In embodiments, the air-port(s) 108 further allows the communication of vacuum and/or positive pressure through a tip 104 installed therein, allowing for, inter alia, dies to be held to the tip 104 via vacuum. By using positive pressure, the air acts against the spring-seated swivel ball profiles to help float the tip 104 into mating with the surface of a die. In such embodiments, vacuum can also be used to lock the tip 104 into place.

Figure 2:
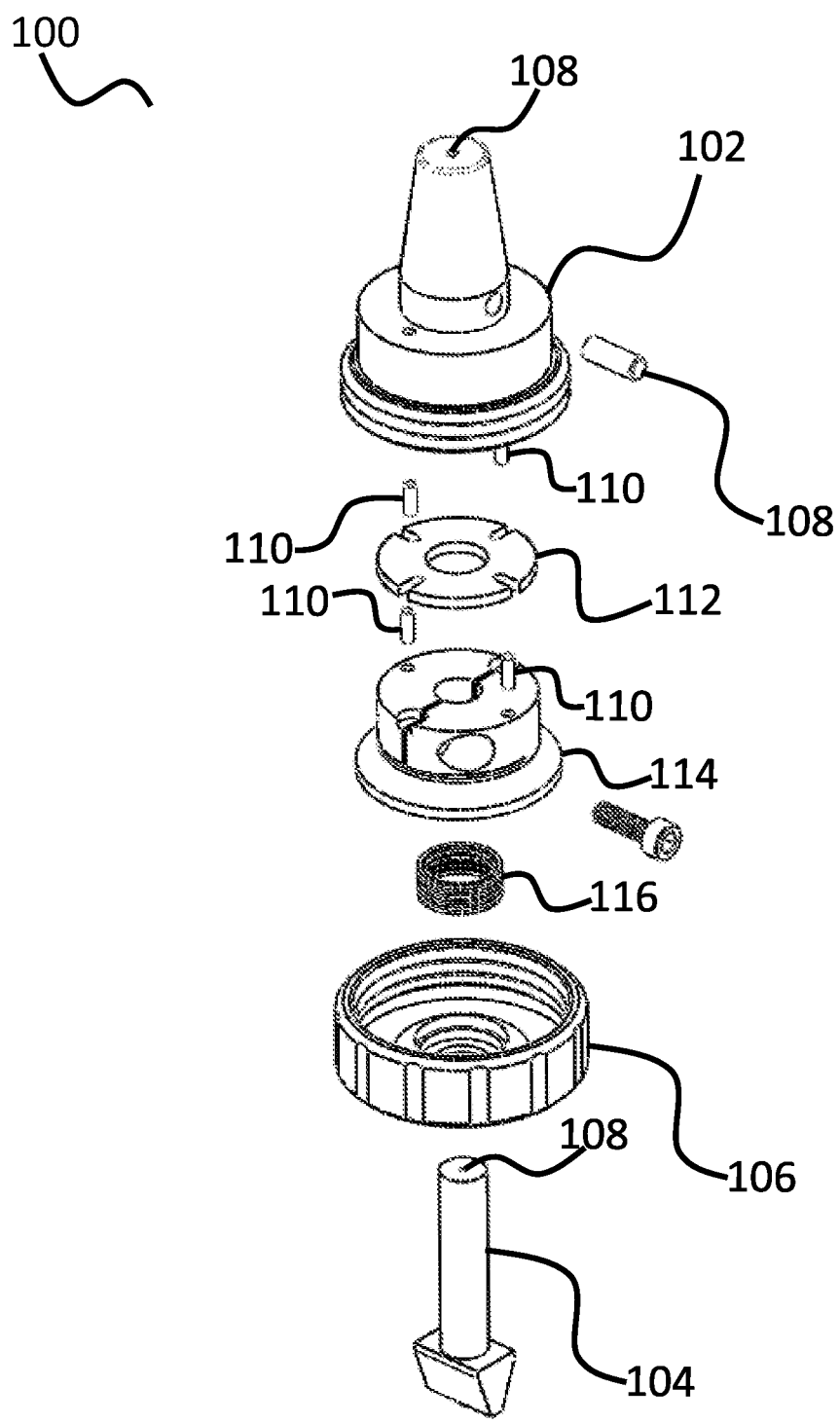
FIG. 2 is an exploded view of a self-aligning tip system using a coupling-style anti-rotate feature, in accordance with embodiments of the present disclosure.
Figure 3:
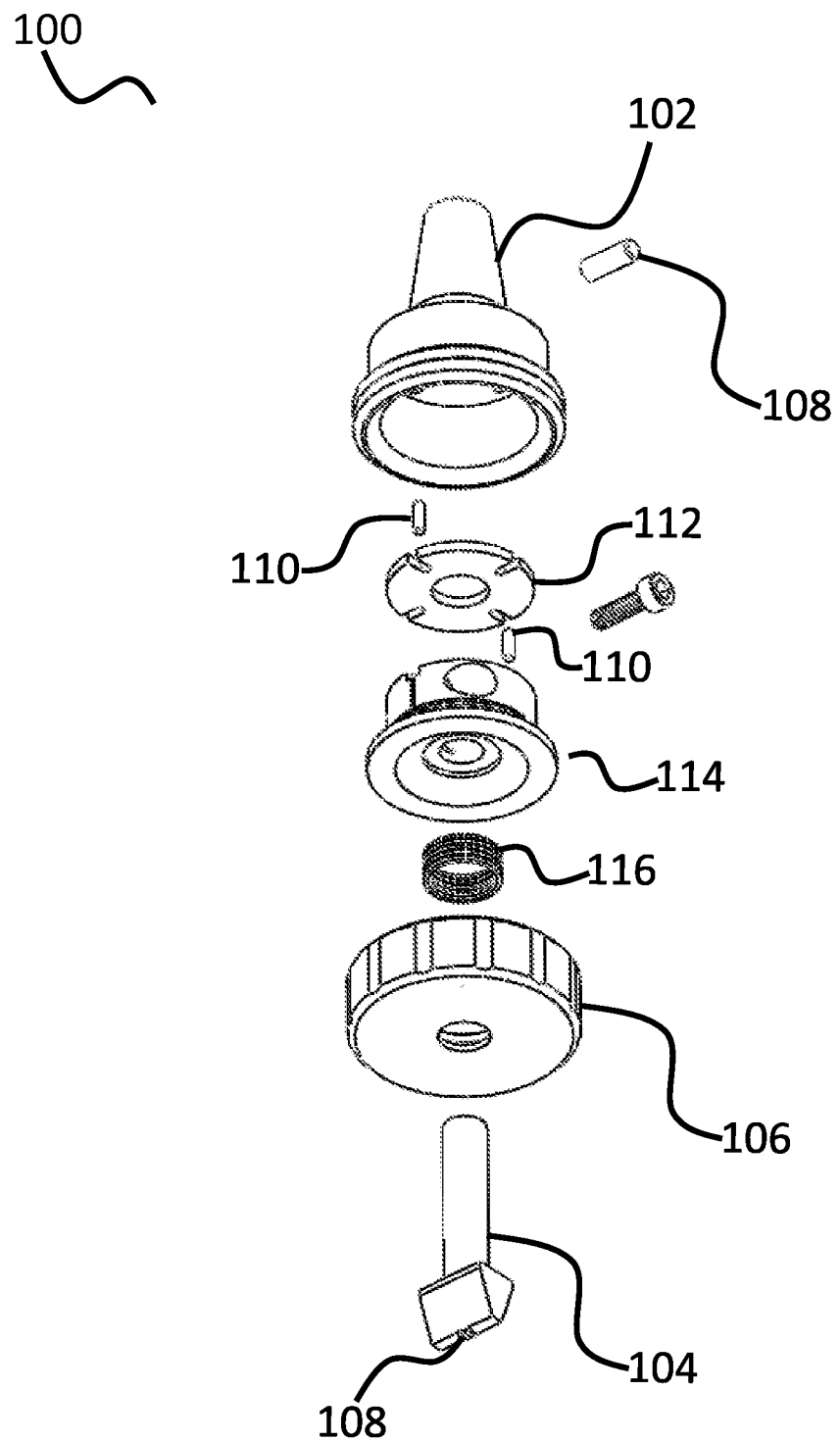
FIG. 3 is an exploded view of a self-aligning tip system using a coupling-style anti-rotate feature, in accordance with embodiments of the present disclosure.

In embodiments, such as those depicted in FIGS. 1-3, the tip holder 102 comprises a coupler 112, in embodiments a universal joint disk 112, configured to allow the tip 104 to fully swivel in roll, pitch and yaw while maintaining accurate theta registration. The coupler 112 of embodiments utilizes multiple pins 110 loosely located partially in the tip holder 102 and partially located in the lockable swivel collar 114 to allow relative motion between the two. In embodiments, a slotted disk 112 is inserted between the tip holder 102 and lockable swivel collar 114.

Figure 4:
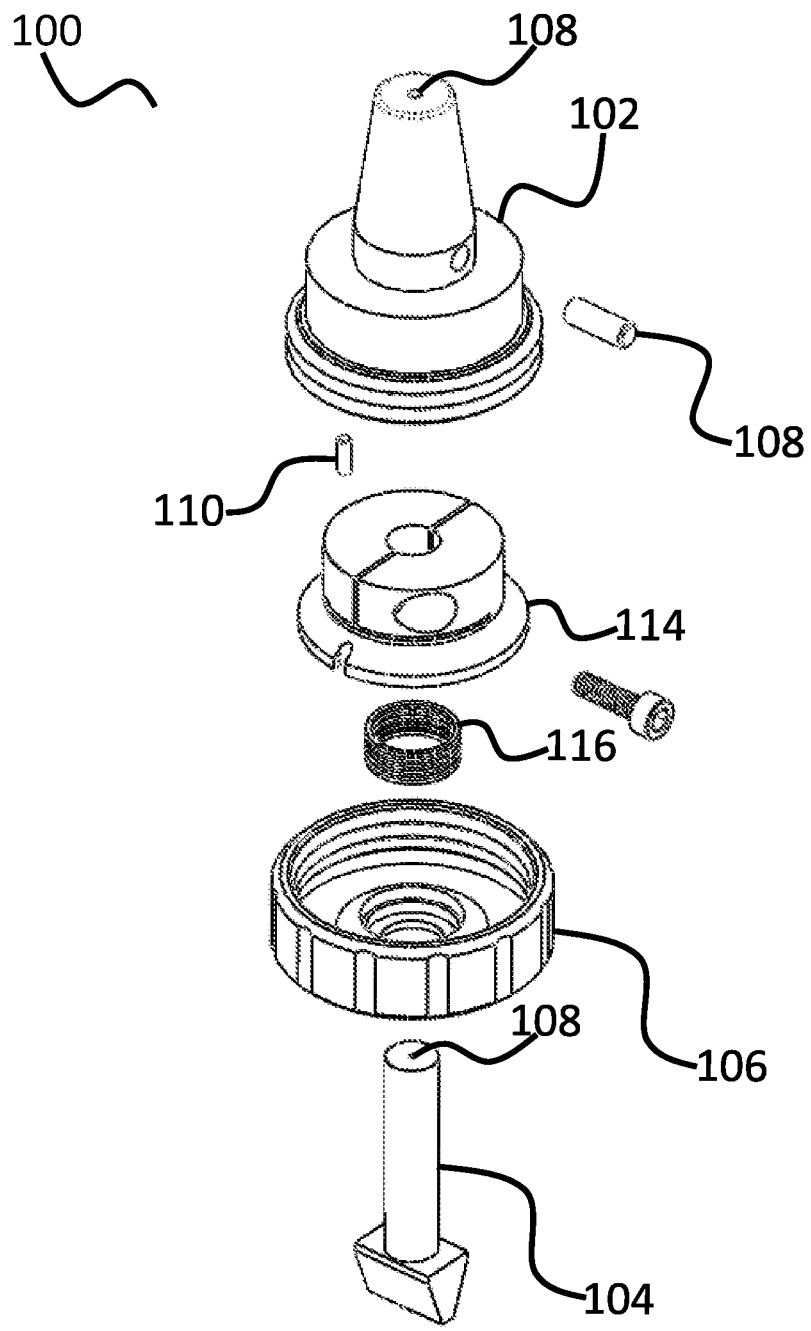
FIG. 4 is an exploded view of a self-aligning tip system using a pin-style anti-rotate feature, in accordance with embodiments of the present disclosure.
Figure 5:
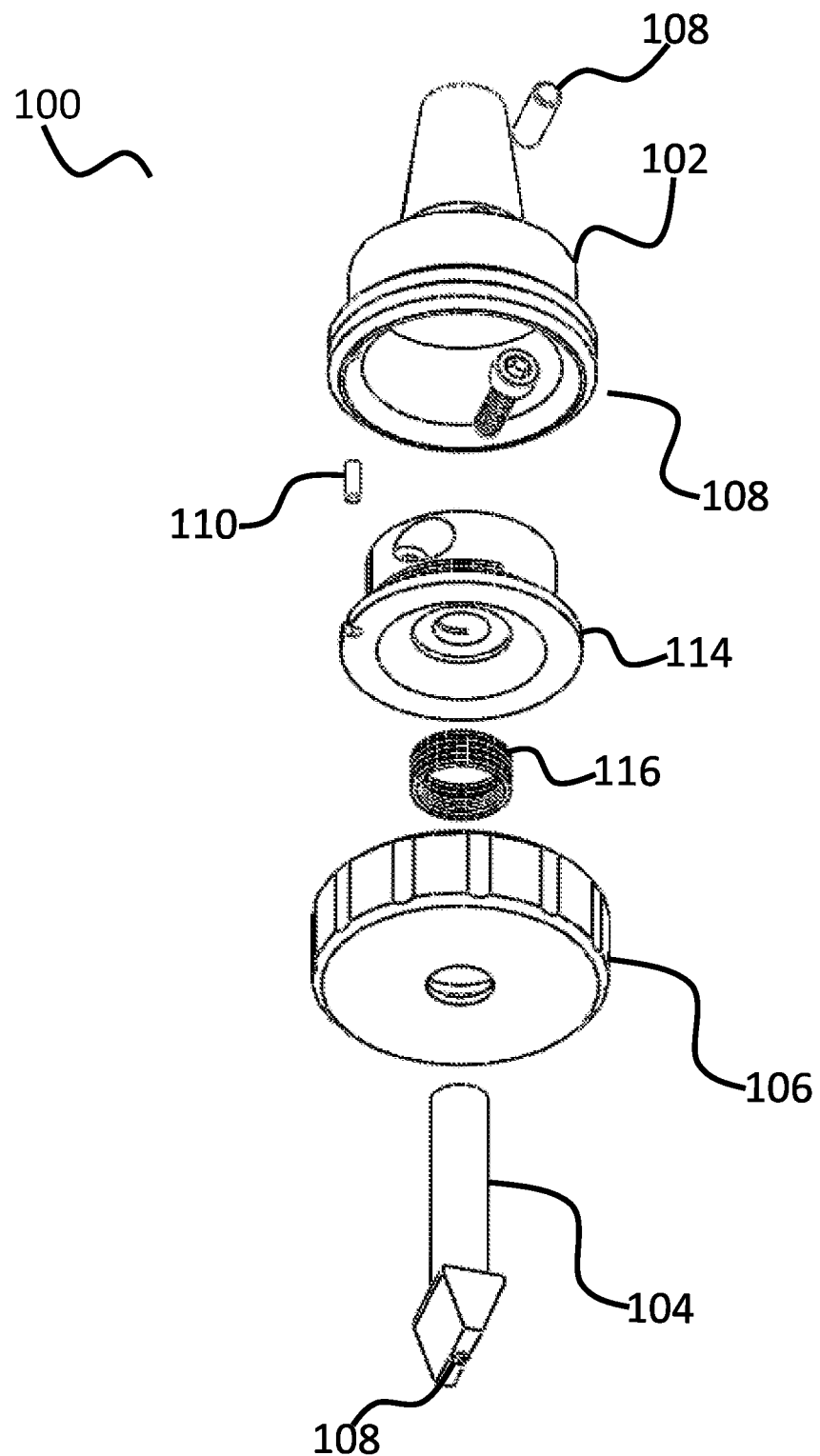
FIG. 5 is an exploded view of a self-aligning tip system using a pin-style anti-rotate feature, in accordance with embodiments of the present disclosure.

In other embodiments, such as those depicted in FIGS. 4 and 5 comprise at least one dowel pin 110 to rotationally fix the lockable swivel collar 114, in embodiments in addition to the coupler 112 previously described and in other embodiments in lieu of the coupler 112, while still allowing the tip 104 to fully swivel in roll, pitch and yaw while maintaining accurate theta registration.

Figure 6:
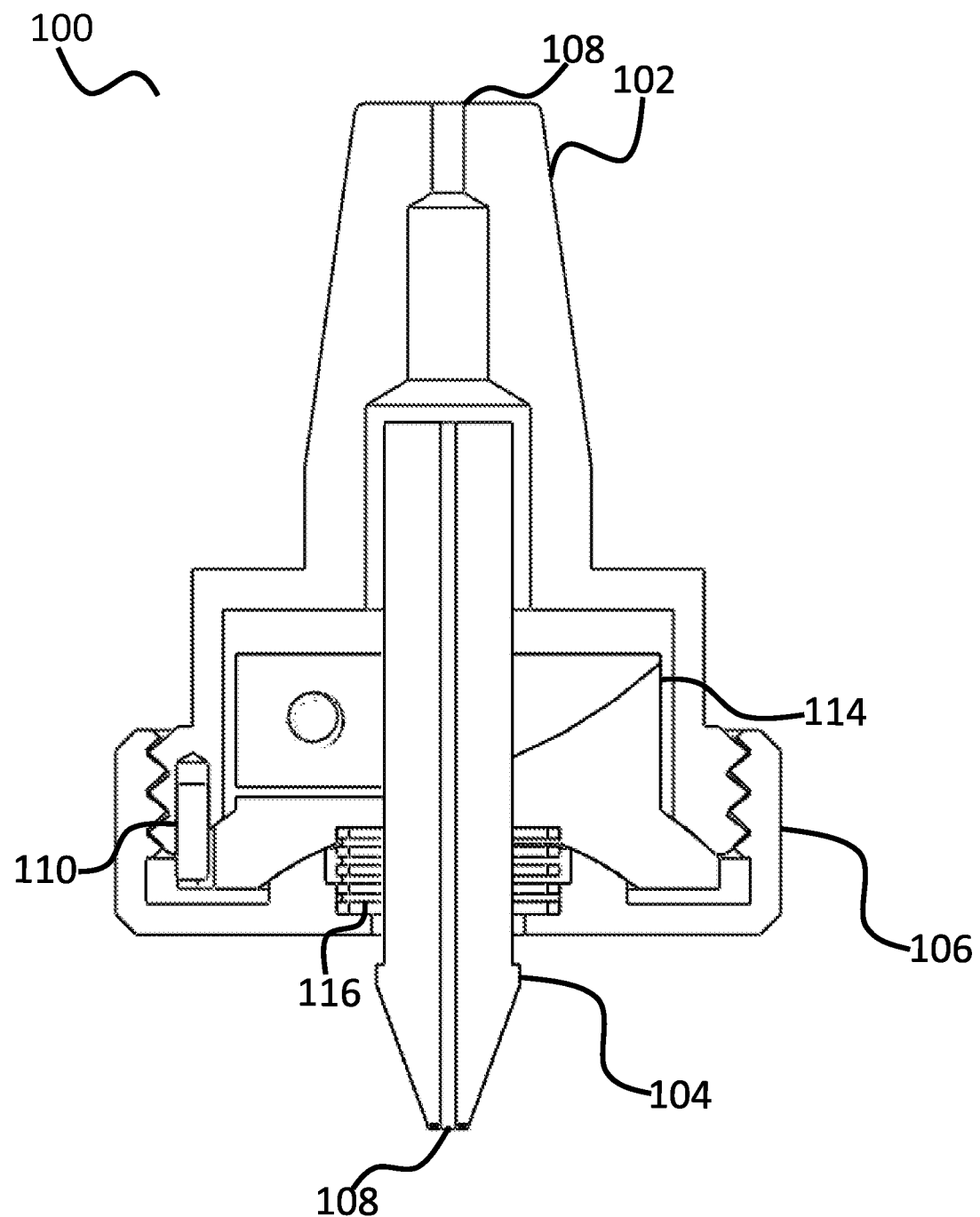
FIG. 6 is a schematic showing a self-aligning tip system using a pin-style anti-rotate feature with the tip locked in a neutral position, in accordance with embodiments of the present disclosure.
Figure 7:
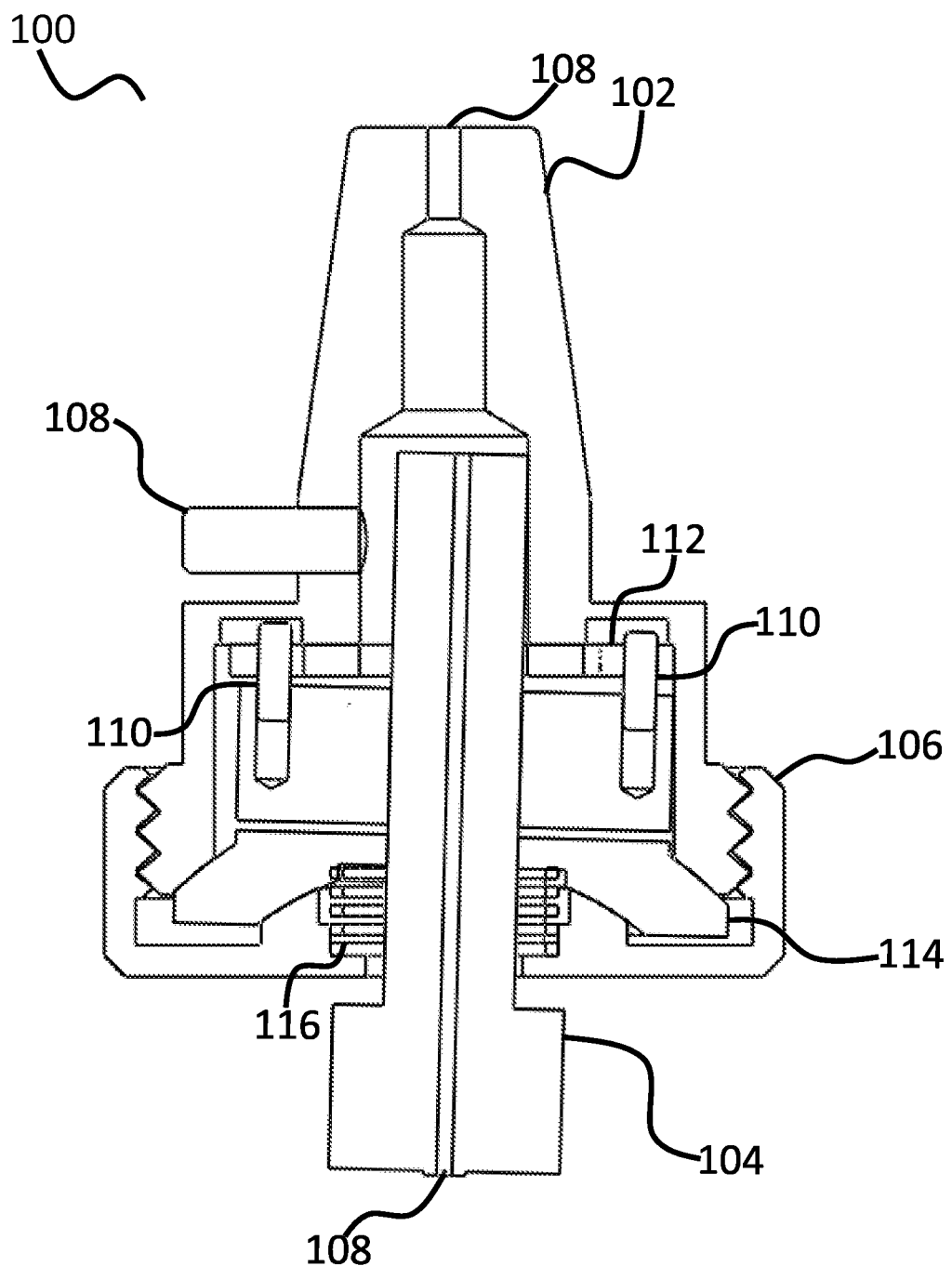
FIG. 7 is a schematic showing a self-aligning tip system using a coupling-style anti-rotate feature with the tip locked in a tilted position, in accordance with embodiments of the present disclosure.

The aforementioned ability of the tip 104 to fully swivel in roll, pitch and yaw while maintaining accurate theta registration is depicted in FIGS. 6 and 7, which show a pin-style embodiment of the self-aligning tip system 100 locked in a neutral position and a coupling-style embodiment of the self-aligning tip system 100 locked in a tilted position, respectively. As can be seen in the referenced Figures, with the locking cap 106 tight, an internal spring 116 is compressed and there are no gaps between the locking cap 106, lockable swivel collar 114, and tip holder 102, effectively locking in angular alignment.

In embodiments, the tip holder 102 is sized to accommodate standard tips 104, allowing it to be used with off-the-shelf parts.

Figure 8:
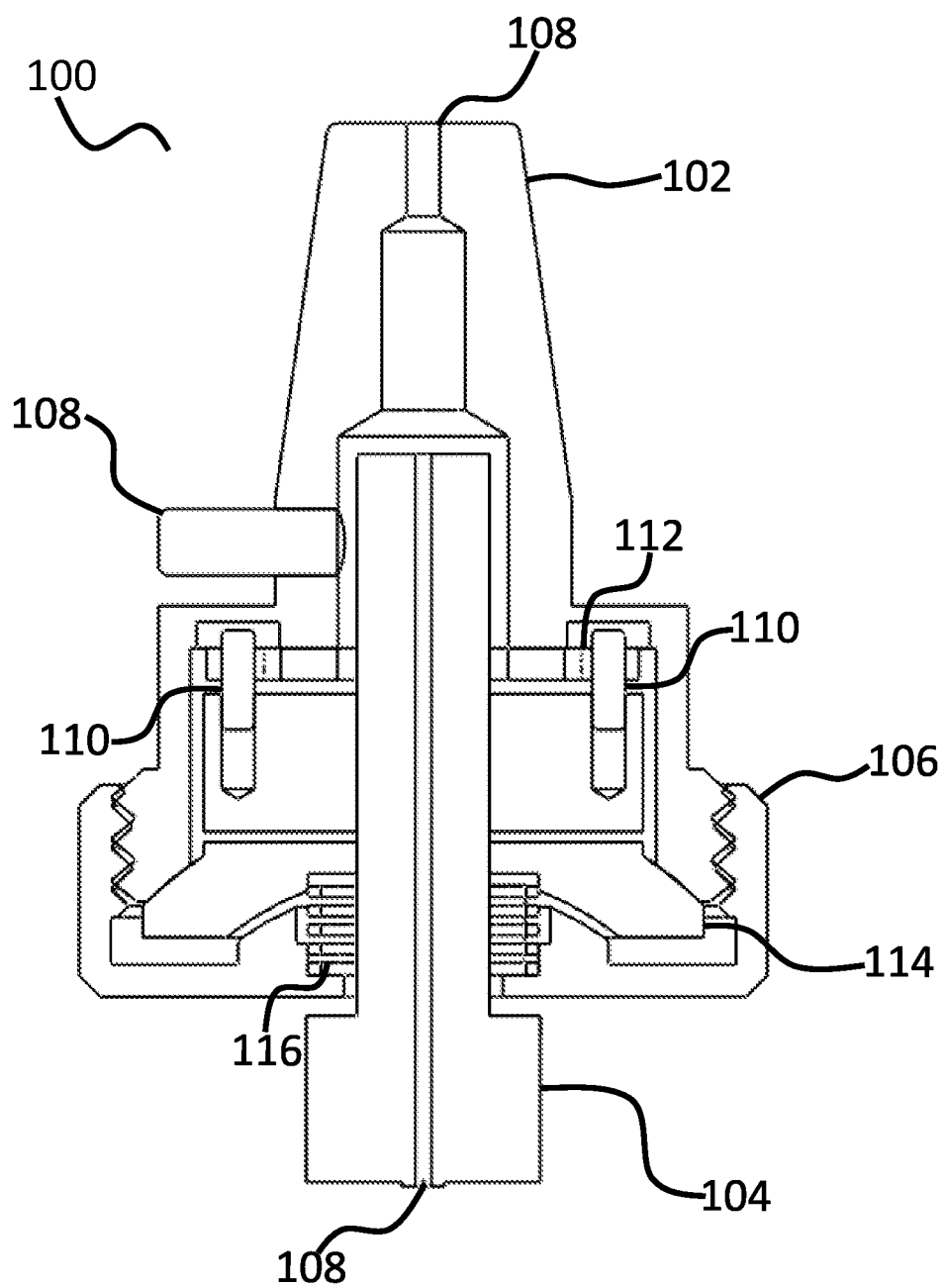
FIG. 8 is a schematic showing a self-aligning tip system using a coupling-style anti-rotate feature with the tip in an unlocked configuration, in accordance with embodiments of the present disclosure.

In embodiments, the self-aligning tip system 100 has the ability to run in a self-aligning mode for each individual pick or can be aligned and locked in a "locked mode" for global placement on non-level surfaces. In embodiments, this tip locking feature is enabled by tightening a locking cap 106, which, in embodiments, is a knurled cap 106, configured to be threaded onto the tip holder 102 and configured to clamp all swivel joint surfaces (i.e. an inside surface of the lockable swivel collar 114 to the swivel ball profile disposed in a backside of the locking cap 106, and an outside surface of the lockable swivel collar 114 to a swivel ball profile disposed in the tip holder 102) locking them together. This feature is best illustrated in FIG. 8, which depicts the self-aligning tip system 100 in an unlocked state (i.e. the locking cap 106 is relatively loose, allowing the internal spring 116 to push corresponding surfaces of the lockable swivel collar 114, swivel ball profile disposed in the tip holder 102, and swivel ball profile disposed in a backside of the locking cap 106 apart) allowing the tip 104 to self-align during a die bonding operation. More specifically, with the locking cap 106 loosened, the spring 116 is uncompressed and there is a gap between the lockable swivel collar 114 and adjacent elements, allowing the angle between the tip 104 and tip holder 102 to be altered. In this configuration, the spring 116 keeps the relevant swivel ball profiles seated and biased towards a neutral position.

In embodiments, with the tip 104 in an unlocked position, the tip 104 is configured to utilize a burst or steady stream of air through an air-port 108 in the tip 104 to create a frictionless tip 104 alignment, reducing downward forces normally required to seat the tip 104 against the top of a die. Alternatively, vacuum can then be used to temporarily lock the tip 104 into position.

In embodiments, tip 104 alignment occurs with the center of rotation located at the bottom of a die to help mitigate die scrubbing (i.e. relative motion in the X and/or Y directions while the die and tip 104 are in contact). Other locations for the center of rotation are available through customization when dealing with different thickness dies. In embodiments, customization of the center of rotation is accomplished by changing the shape of the lockable swivel collar 114, the tip holder 102, and/or or swivel ball profile disposed in a backside of the locking cap 106.

In embodiments, an internal spring 116 biases the self-aligning tip system 100 to return back to a neutral position after die placement. The spring can also be configured to help freeze the tip orientation after each die pick/alignment by increasing friction in the swivel ball system or ball joint formed by the locking cap 106 and the lockable swivel collar 114, thereby allowing the swivel ball system to retain the angle used in a prior die bonding operation during a subsequent die bonding operation.

Figure 9:
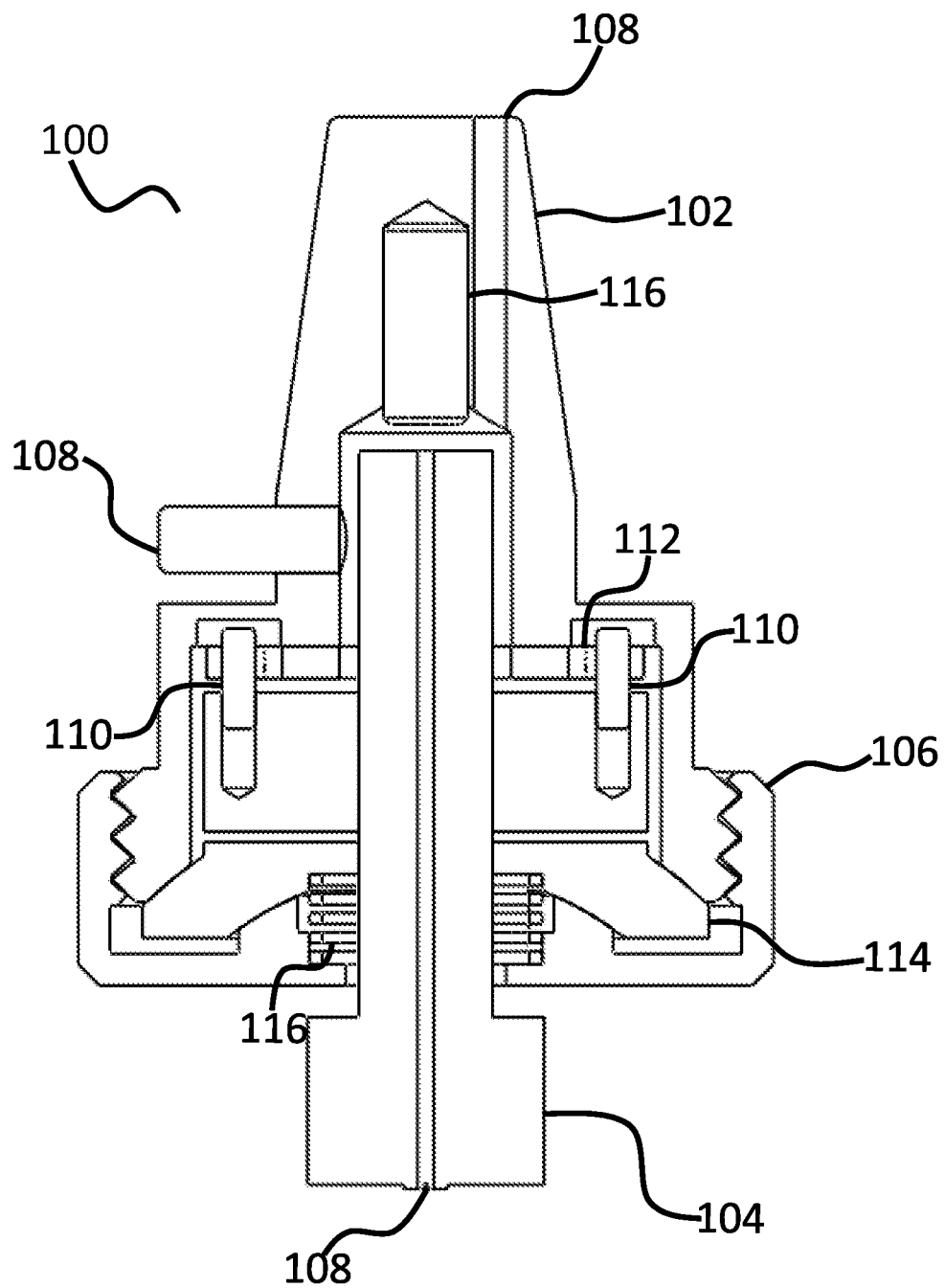
FIG. 9 is a schematic showing a self-aligning tip system using a coupling-style anti-rotate feature with the tip locked in a neutral position, the system including a magnet configured to bias the tip into a neutral position, in accordance with embodiments of the present disclosure.

In embodiments, such as that depicted in FIG. 9, the self-aligning tip system 100 employs a magnetic neutral return 900, using a magnet 900 disposed in the tip holder 102, either instead of or in addition to a spring 116. The magnet 900 of such embodiments essentially provides the same function as the spring 116, but can allow for more flexibility in operation under some circumstances. In embodiments, the magnet 900 is used without a spring 116.

In embodiments, the tip 104 uses a clamp collar type of tip retention, with the lockable swivel collar 114 serving as the clamp, allowing a multitude of off-the-shelf standard tips 104 to be used. In embodiments, the locking cap 106 includes preloaded locking tabs, the preloaded locking tabs being configured to prevent rotation of the lockable swivel collar 114 relative to the self-aligning tip system 100, when tightened.

This design allows for less than perfect planarity of the pick and place, or die bonding system, machine gantry and deck tools. This can be achieved by simply planarizing the tip 104 to a surface requiring compensation to ensure planarity and tightening the locking cap 106 to capture that position.

The design also allows for customers to manufacture dies/substrates that have greater planarity errors than would normally be allowed simply by loosening the locking cap 106 and allowing the tip 104 to go into a full angular compliance mode where it automatically planarizes a die held by a tip 104 to a substrate at each die bond operation, within the limits of compliance of the lockable swivel collar 114.

Figure 10:
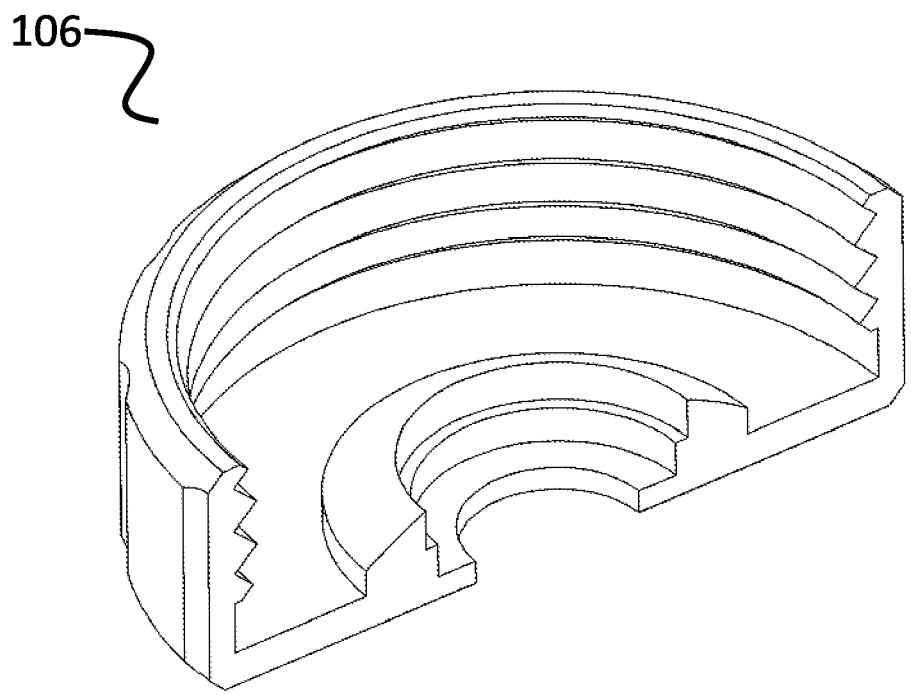
FIG. 10 is a section view of a locking cap, in accordance with embodiments of the present disclosure.
Figure 11:
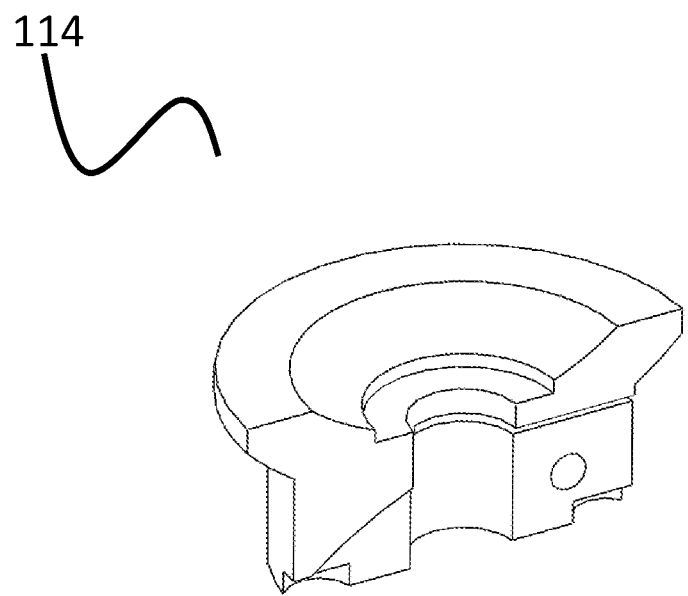
FIG. 11 is a section view of a lockable swivel collar, in accordance with embodiments of the present disclosure.
Figure 12:
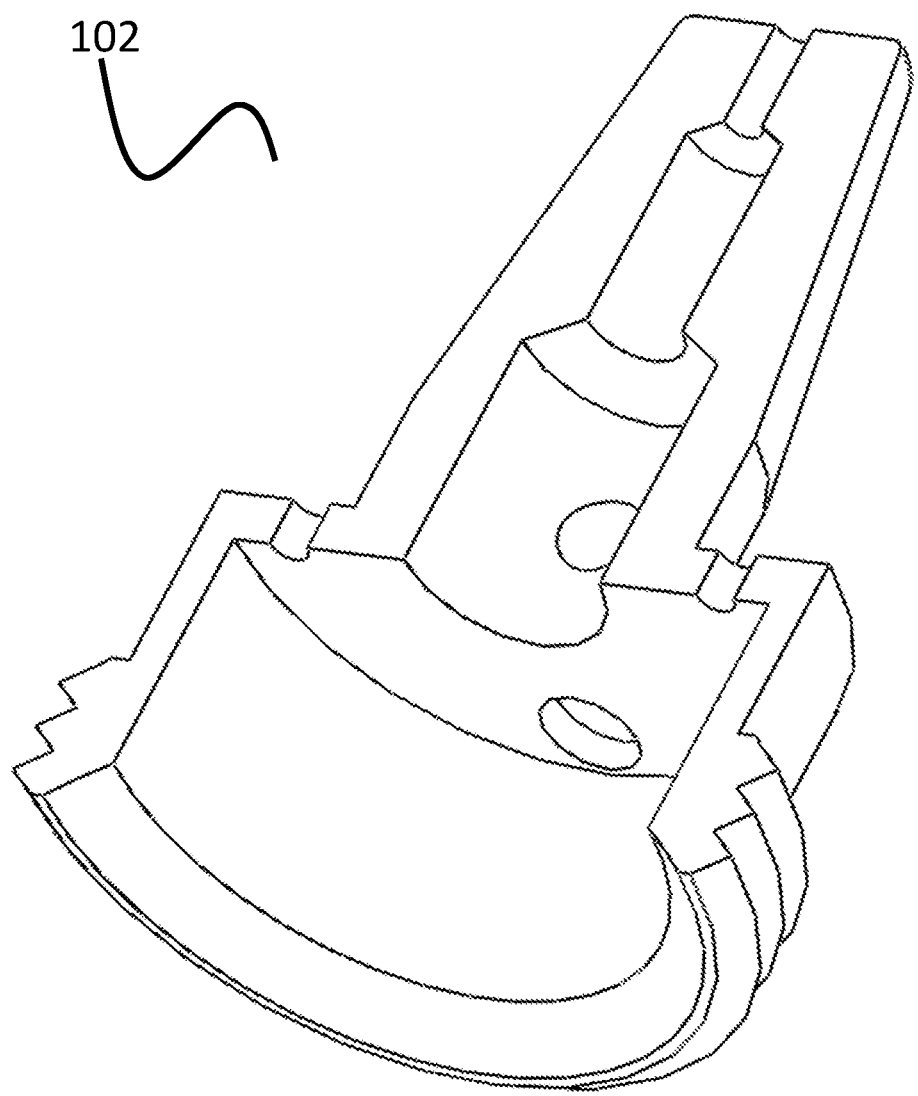
FIG. 12 is a section view of a tip holder, in accordance with embodiments of the present disclosure.

Views of the individual components making up the aforementioned assemblies are provided in FIGS. 10, 11, and 12.

More specifically, FIG. 10 depicts a lockable cap 106 having an internal swivel ball profile configured to mate with the internal swivel ball profile disposed in the lockable swivel collar 114, in accordance with embodiments of the present disclosure.

Now referring to FIG. 11, a lockable swivel collar 114 comprising an internal swivel ball profile and an external swivel ball profile that also includes an integrated clamp collar configured to retain a tip 104 is depicted, in accordance with embodiments of the present disclosure, is shown.

FIG. 12 shows a tip holder 102 in sectional view including a threaded portion configured to receive the locking cap 106, in accordance with embodiments of the present disclosure.

Figure 13:
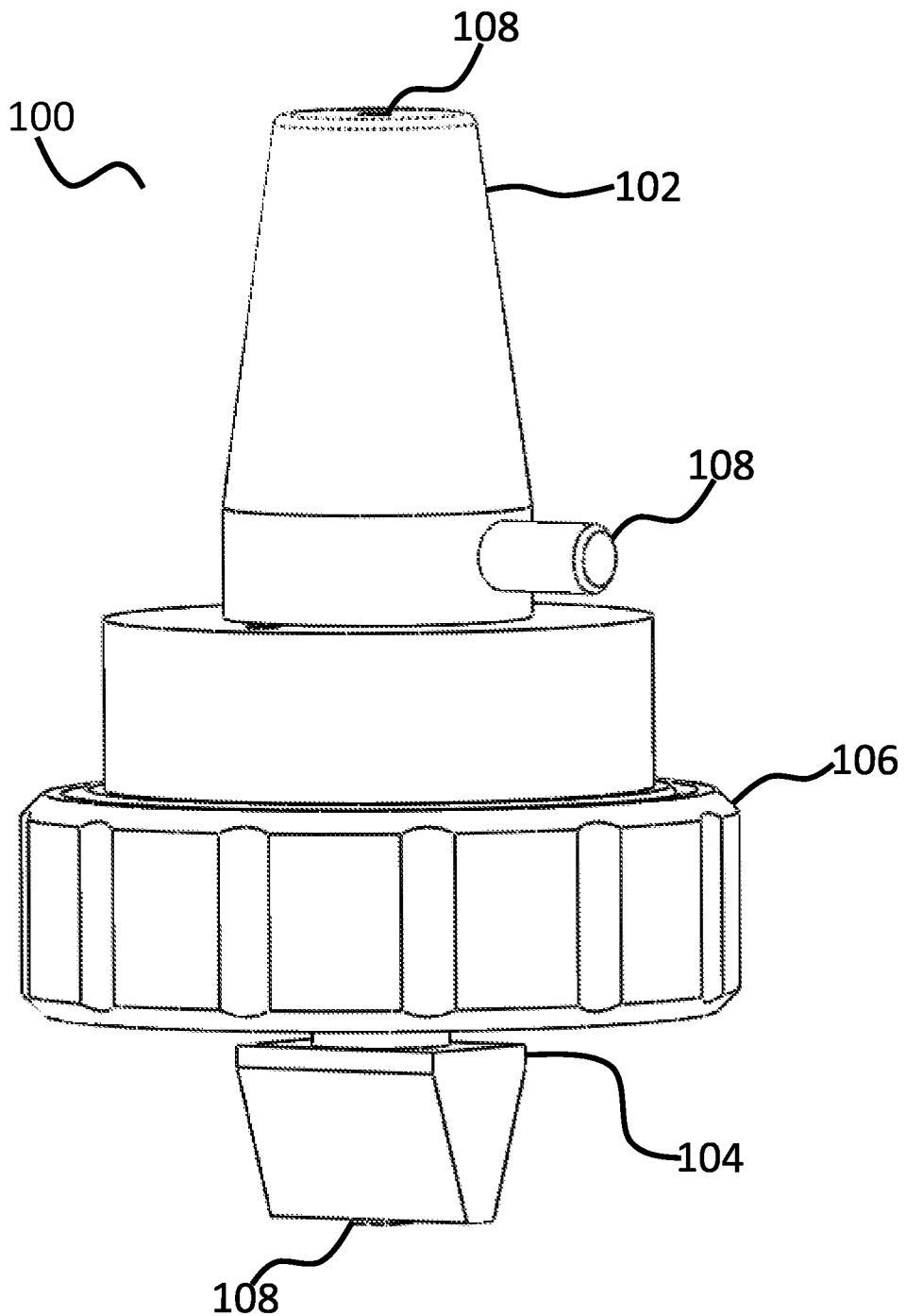
FIG. 13 is a side elevation view of a tip held by a tip holder including a locking cap, in accordance with embodiments of the present disclosure.
Figure 14:
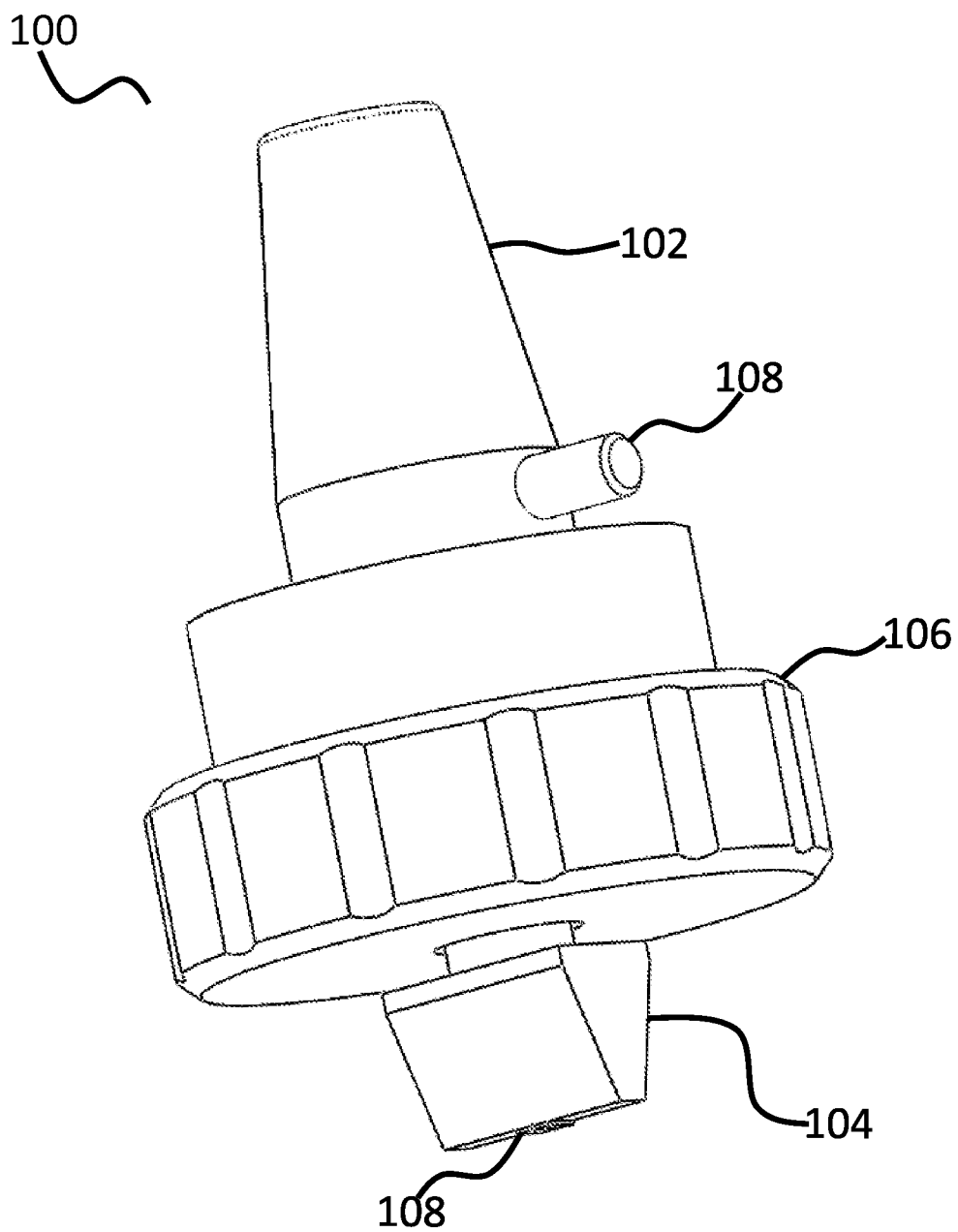
FIG. 14 is a perspective view of a tip held by a tip holder including a locking cap, in accordance with embodiments of the present disclosure.

Now referring to FIGS. 13 and 14, these Figures show the self-aligning tip system 100 of embodiments as solid views, detailing their outside appearance.

Figure 15:
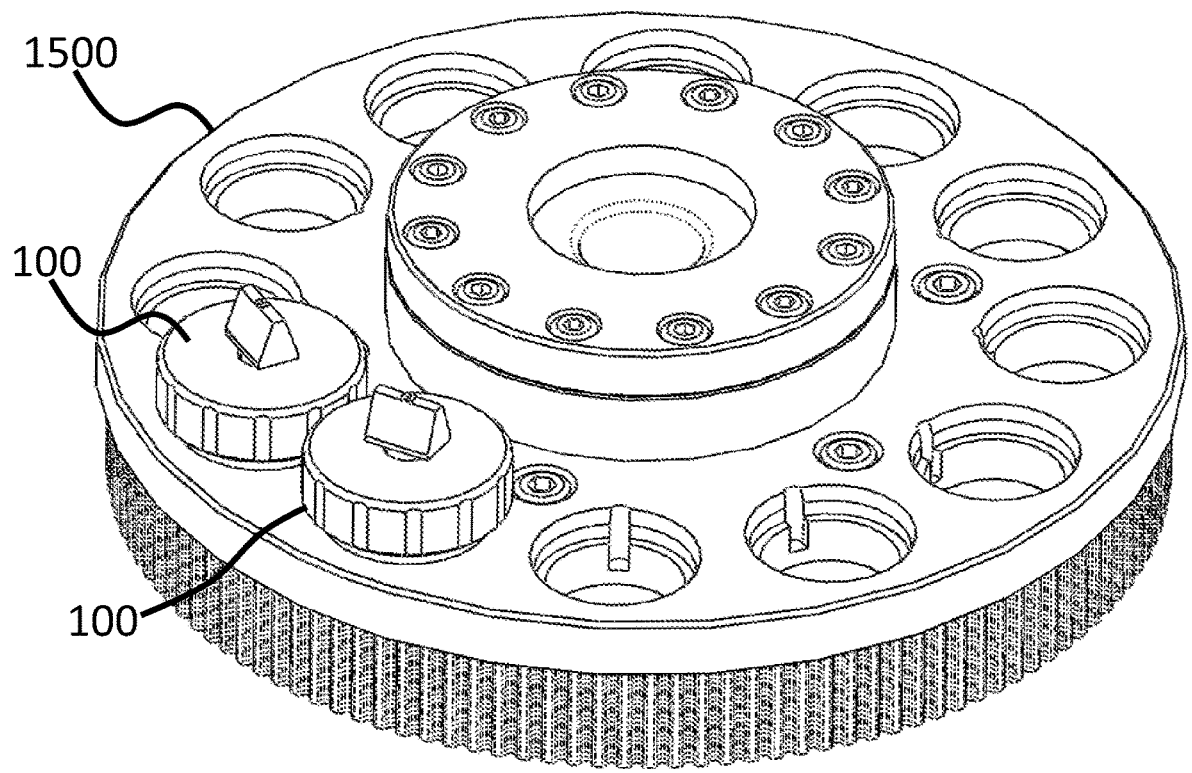
FIG. 15 is a perspective view of self-aligning tip systems held by a turret, in accordance with embodiments of the present disclosure.

Now referring to FIG. 15, embodiments such as that depicted in FIG. 15 provide a thermocompression bonding system including an improved die placement system that allows for the efficient placement of multiple die types by a single die placement system during a die placement cycle, yielding improvements in cycle times and accuracy. This is accomplished through minimization of the movement of the die placement system in operations involving the placement of multiple dies on a single substrate where tips 104 must be swapped to accommodate differently sized dies by incorporating a die placement head holding turret 1500, a rotating holder for tools, into the die placement system. The turret 1500 of such a system, in embodiments, carries a plurality of self-aligning tip systems 100, with each self-aligning tip system 100 carrying a tip 104 necessary for use in a particular application, negating the need for the die placement system to return to a traditional tool holder between die placement operations involving differently sized dies. In embodiments, the turret 1500 may incorporate permanent magnets, electro-magnets, vacuum passages or combinations thereof to retain the self-aligning tip systems 100 when not in use. Other suitable means of retaining the self-aligning tip systems 100 within the turret 1500 would be apparent to one of ordinary skill in the art.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A self-aligning tip system comprising:
   a tip holder comprising, a threaded section disposed on a distal end thereof, and a hollow inner cavity;
   a lockable swivel collar disposed in the hollow inner cavity of the tip holder, the lockable swivel collar comprising a central aperture configured to retain a tip; and
   a locking cap comprising a central aperture configured to allow a tip to pass therethrough, wherein the locking cap is configured to be threaded onto the threaded section of the tip holder and to retain the lockable swivel collar inside of the inner cavity of the tip holder,
   wherein, when the locking cap is installed loosely, a tip retained in the lockable swivel collar is allowed to swivel in roll, pitch and yaw while maintaining accurate theta registration, and wherein, when the locking cap is installed tightly, a tip retained in the lockable swivel collar is locked in terms of roll, pitch and yaw.

2. The self-aligning tip system of claim 1 wherein the tip holder comprises an upper section configured to be retained in a die bonding system.

3. The self-aligning tip system of claim 1 wherein the lockable swivel collar comprises swivel ball profiles on top and bottom sides thereof and wherein the tip holder and locking cap comprise corresponding swivel ball profiles on a bottom portion and a top portion thereof, respectively.

4. The self-aligning tip system of claim 1 further comprising a spring disposed between the lockable swivel collar and locking cap.

5. The self-aligning tip system of claim 4 wherein the locking cap and lockable swivel collar comprise spring seats configured to locate the spring.

6. The self-aligning tip system of claim 4 wherein the spring is configured to bias a tip retained in the lockable swivel collar to a neutral position.

7. The self-aligning tip system of claim 4 further comprising a magnet disposed in the tip holder.

8. The self-aligning tip system of claim 7 wherein the magnet is configured to bias a tip retained in the lockable swivel collar to a neutral position.

9. The self-aligning tip system of claim 1 further comprising a magnet disposed in the tip holder.

10. The self-aligning tip system of claim 9 wherein the magnet is configured to bias a tip retained in the lockable swivel collar to a neutral position.

11. The self-aligning tip system of claim 1 wherein the self-aligning tip system is configured such that tip alignment occurs with the center of rotation located at the bottom of a die held by a tip retained by the lockable swivel collar.

12. The self-aligning tip system of claim 1 further comprising at least one air-port disposed in the tip holder.

13. The self-aligning tip system of claim 12 wherein the self-aligning tip system is configured to utilize vacuum to lock the tip into position.

14. The self-aligning tip system of claim 1 further comprising a tip retained in the lockable swivel collar wherein the tip comprises at least one air port configured to allow the transmission of positive pressure and/or vacuum from a backside of the tip to a distal end thereof, the distal end being configured to mount a die to a substrate.

15. The self-aligning tip system of claim 14 wherein with the tip in an unlocked position, the tip is configured to utilize a burst or steady stream of air through the at least one air-port disposed therein to reduce the friction associated with tip alignment.

16. The self-aligning tip system of claim 1 wherein the lockable swivel collar utilizes a clamp-collar retention system to retain a tip.

17. The self-aligning tip system of claim 1 wherein the locking cap further comprises preloaded locking tabs configured to prevent rotation of the lockable swivel collar relative to the self-aligning tip system, once tightened.

18. A method of planarizing a tip to a substrate, the method comprising:
using a self-aligning tip system in accordance with claim 1:
retaining a tip within the lockable swivel collar;
loosening the locking cap, thereby allowing the tip to swivel in roll, pitch and yaw while maintaining accurate theta registration;
bringing the tip into contact with the substrate; and
tightening the locking cap, thereby locking the tip in roll, pitch and yaw.

19. A self-aligning tip system comprising:
a tip holder comprising at least one air-port, a threaded section disposed on a distal end thereof, and a hollow inner cavity;
a lockable swivel collar comprising a central aperture configured to retain a tip;
a locking cap disposed in the hollow inner cavity of the tip holder, the lockable swivel collar comprising a central aperture configured to allow a tip to pass therethrough, wherein the locking cap is configured to be threaded onto the threaded section of the tip holder and to retain the lockable swivel collar inside of the inner cavity of the tip holder; and
a spring disposed between the lockable swivel collar and locking cap,
wherein, when the locking cap is installed loosely, a tip retained in the lockable swivel collar is allowed to swivel in roll, pitch and yaw while maintaining accurate theta registration,
wherein, when the locking cap is installed tightly, a tip retained in the lockable swivel collar is locked in terms of roll, pitch and yaw,
wherein the tip holder comprises an upper section configured to be retained in a die bonding system,
wherein the spring is configured to bias a tip held retained in the lockable swivel collar to a neutral position,
wherein the lockable swivel collar comprises swivel ball profiles on top and bottom sides thereof and wherein the tip holder and locking cap comprise corresponding swivel ball profiles on a bottom portion and a top portion thereof, respectively.

* * * * *